Figure 1:
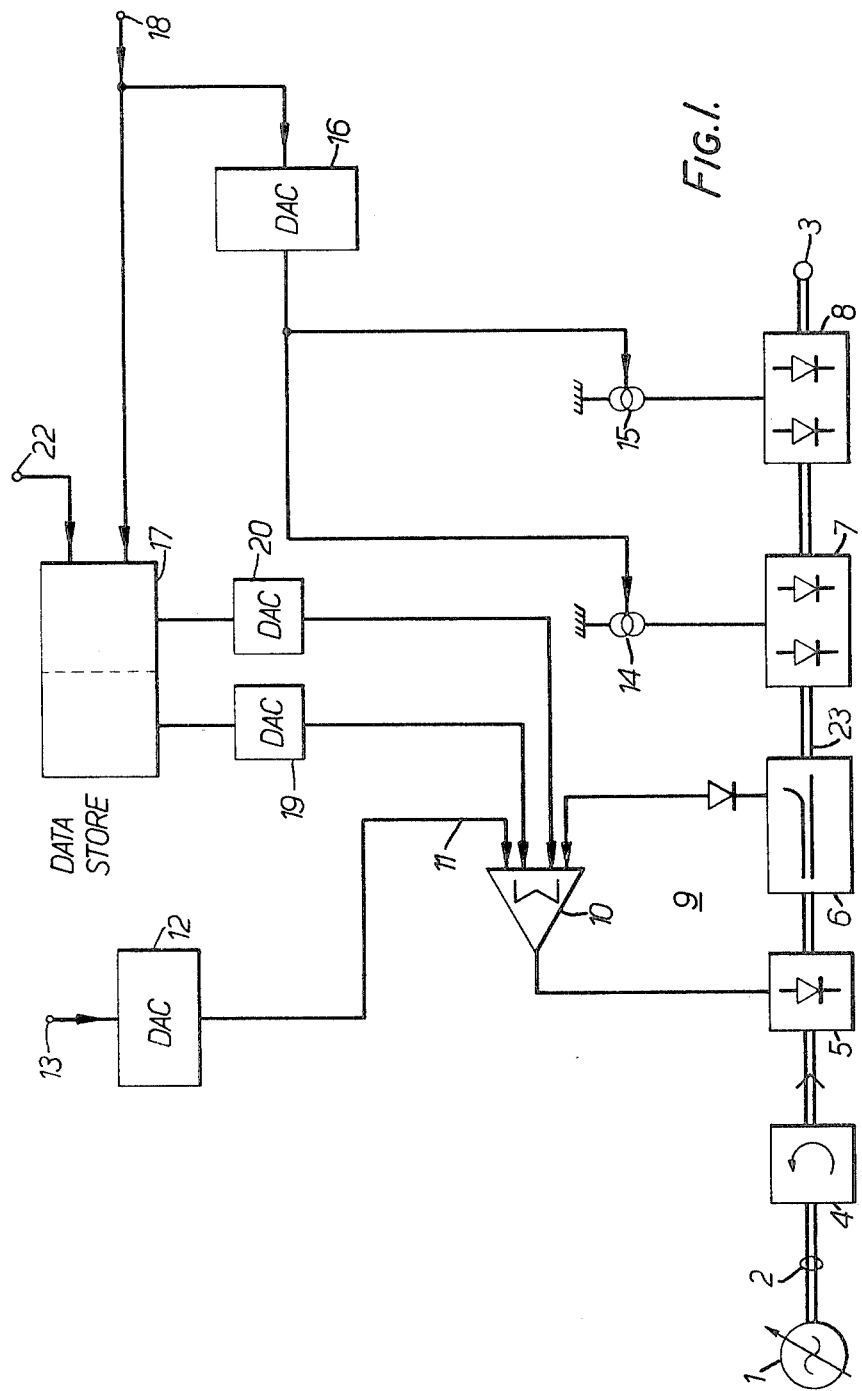

United States Patent [19]

Hurst et al.

[11] 4,249,144
[45] Feb. 3, 1981

[54] CONTROLLABLE MICROWAVE ATTENUATOR

[75] Inventors: Geoffrey J. Hurst, Bassingbourn; Andrew W. Butler, Letchworth, both of England

[73] Assignee: Marconi Instruments Limited, Chelmsford, England

[21] Appl. No.: 100,002

[22] Filed: Dec. 4, 1979

[30] Foreign Application Priority Data

Dec. 13, 1978 [GB] United Kingdom ............... 48413/78

[51] Int. Cl.³ .............................................. H03H 7/25
[52] U.S. Cl. ................................. 333/81 R; 333/81 A
[58] Field of Search ................. 333/81 R, 81 A, 81 B; 323/74, 80, 81

[56] References Cited

U.S. PATENT DOCUMENTS 3,652,959  3/1972  Denny .................................. 333/81 R

FOREIGN PATENT DOCUMENTS 2259991  7/1973  Fed. Rep. of Germany ........ 333/81 R Primary Examiner—Paul L. Gensler
Attorney, Agent, or Firm—Spencer & Kaye

[57] ABSTRACT

A microwave attenuator consists of a plurality of variable attenuation PIN diodes connected in a serial path. At least one of the diodes forms part of a feed-back loop so that the attenuation level it provides can be adjusted to correspond with a reference signal. The effective level of the reference signal is modified in accordance with correction factors, by means of which non-linearities in the performance of the remaining diodes can be compensated.

7 Claims, 2 Drawing Figures

CONTROLLABLE MICROWAVE ATTENUATOR

This invention relates to microwave attenuation. The need arises, particularly in connection with microwave signal generators, to attenuate a microwave signal by a precise and controllable amount. However variable attenuator elements which are suitable for use at microwave frequencies do not have strictly linear characteristics, that is to say, the degree of attenuation produced is not strictly linearly related to the magnitude of the signal used to control the attenuator. The present invention seeks to provide an improved microwave attenuation circuit in which the effect of non-linearities in the attenuator elements is minimised.

According to this invention a microwave attenuation circuit includes at least two variable impedance diodes connected in a serial path, one end of which is arranged to receive an applied microwave signal and the other end of which provides an attenuated output signal, one diode forming part of a feedback loop in which a signal attenuated by it is combined with a variable reference signal representative of a particular degree of attenuation so as to control the attenuation of said one diode, the impedance of the further diode being variable in discrete steps by selection of particular values of a bias signal applied to it; and means for modifying the attenuation of said one diode in dependence on the value of the selected bias signal to compensate for non-linearities in said further diode or diodes.

Preferably said means includes a data store containing correction factors relating to each selectable value of bias signal.

Preferably again the diodes are PIN diodes. The impedance of such diodes is dependent on the frequency of a microwave signal applied to it, and so preferably the correction factors held in said store also relate to the frequency of a signal applied to the microwave attenuation circuit.

To provide a wide range of attenuation, preferably at least two said further diodes are provided in said serial path and arranged so that the impedance of each can be varied independently in discrete steps.

Preferably again said further diode, or further diodes, as the case may be, are maintained at a stabilised temperature so that additional impedance variations caused by temperature changes are minimised.

In order that the required range of attenuation can be provided, each of said further diodes may be provided with additional diodes to form a group of diodes which are ganged together. In this case preferably two groups of such diodes are provided in said serial path, each group being arranged so as not to interact with the other group.

Figure 2:
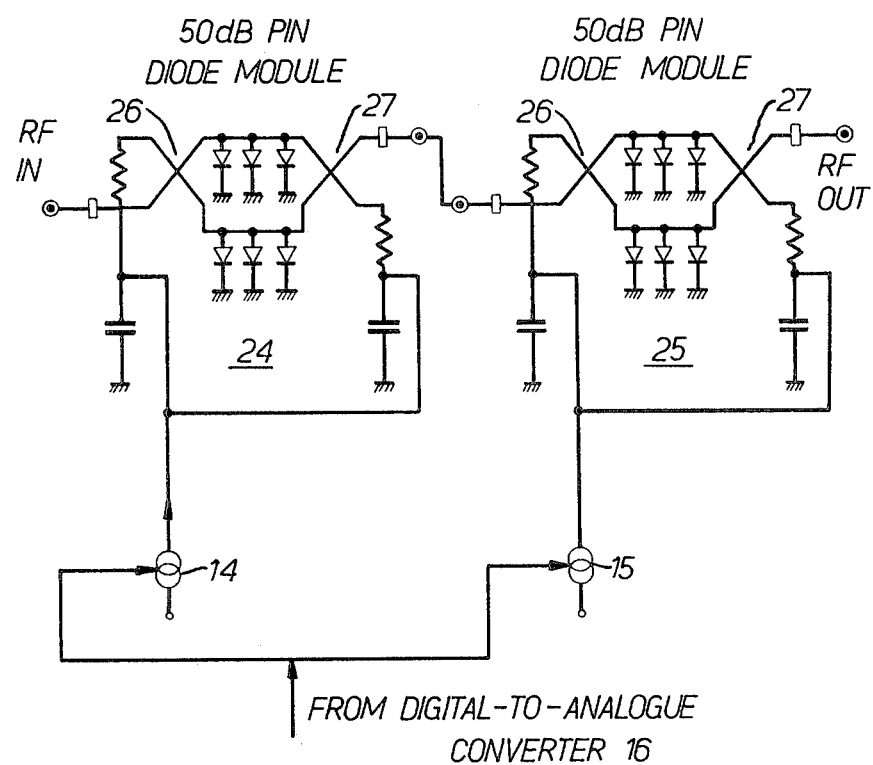

The invention is further described by way of example with reference to the accompanying drawing in which, FIG. 1 illustrates diagrammatically a microwave attenuation circuit in accordance with the present invention, and FIG. 2 shows a portion thereof in greater detail.

Referring to the drawings, a microwave signal is generated at a microwave signal generator 1, which, in practice, could be a relatively complex frequency synthesiser, but which is illustrated diagrammatically as a simple variable frequency oscillator. The output of the oscillator is applied to terminal 2, which represents the input terminal of a microwave attenuation circuit. The microwave attenuation circuit comprises a serial path 23 connected between the input terminal 2 and an output terminal 3 at which an appropriately attenuated signal is provided. Connected in sequence in the serial path are an isolator 4, a first PIN diode 5, a microwave coupler 6 and two further PIN diodes 7 and 8. The isolator allows microwave energy to pass from the signal generator 1, but prevents energy passing in the opposite direction. PIN diodes are semiconductor devices which exhibit the effect of changing R.F. impedance with applied d.c. bias. The relationship between R.F. impedance and the magnitude of the d.c. bias is not linear, and at microwave frequencies further non-linearities are present due to parasitic effects associated with the packaging of the diodes and the connections to them. The PIN diode 5 is capable of providing a maximum attenuation of 30 dB but is used to provide only a 10 dB variation in attenuation and the further diodes 7 and 8 are each arranged to provide a maximum attenuation of 50 dB. All three diodes are controlled in discrete steps, the diode 5 being arranged to provide 1 dB steps and the diodes 7 and 8 each being adjustable in 5 dB steps. As explained subsequently, although diodes 7 and 8 are referred to here as being single diodes, in practice each would be constituted by a group of diodes ganged together and connected in parallel with each other in order to provide the required wide range of attenuation values.

The PIN diode 5 and the coupler 6 form part of a feedback loop 9 by means of which non-linearities in the diode 5 can be corrected. The feedback loop 9 includes a diode 21 and an amplifier 10, which receives a first input over line 11 from a logarithmic digital-to-analogue converter 12. The converter 12 receives predetermined attenuation control signals applied to it via input terminal 13 in digital form. Each signal consists of a digital word representative of the required degree of attenuation which is to be produced by the diode 5. In this example the diode 5 is used to provide a range of attenuation of 10 dB and in order to achieve this the digital-to-analogue converter 12 provides a current output which varies in ten steps each corresponding to 1 dB attenuation.

As the amplifier 10 receives the output from the coupler 6, which is a measure of the actual attenuation produced by the diode 5 this signal is used in the feedback loop 9 to control the diode 5 as necessary so that the required degree of attenuation is precisely provided by this diode.

The remaining two diodes 7 and 8 are controlled from constant current sources 14 and 15, which are each arranged to provide ten discrete current values which vary in equal steps. These constant current generators 14 and 15 are controlled by a common linear digital-to-analogue converter 16 so that by arranging that each step corresponds to 5 dB the range of 50 dB is covered by each diode. It is extremely difficult to reliably monitor the output of an attenuator diode which is working over 50 dB attenuation and it is not practicable to provide a feedback loop to compensate for non-linearities in a manner similar to that used for diode 5.

Accordingly, a data store 17 is provided which contains correction factors relating to the degree of attenuation selected for the diodes 7 and 8 and also the frequency applied to terminal 2, since the non-linearities of the diodes are dependent on both of these variables. The data store 17 is filled with the appropriate correction factors when the two diodes 7 and 8 are initially calibrated during manufacture. One method of calibrating the diodes so as to derive the required correction factors is described subsequently. Since the correction factors for diodes 7 and 8 are different, the data store may be divided into two separately identifiable portions, or may comprise two stores if more convenient.

When a particular attenuation value is called up by means of a signal applied to terminal 18, the current sources 14 and 15 are energised as required so that the diodes 7 and 8 produce the required attenuation to a first approximation. The required attenuation factors and the operating frequency are also applied to the data store 17 as location addresses the frequency information being applied via terminal 22. Conveniently the data store 17 is a programmable read-only memory (PROM). The correction factors held at the accessed addresses for each of diodes 7 and 8 respectively are applied to the two digital-to-analogue converters 19 and 20, which provide additional analogue inputs to the amplifier 10 so as to modify the feedback signal applied to the diode 5. The amplifier 10 can be a differential amplifier in which the line from the coupler 6 is regarded as one input, and the remaining inputs being regarded as together constituting a variable reference input. In this way the amplifier 10 is operative to vary the alteration of the diode 5 until the input from coupler 6 is the same as the combined reference value. Thus the correction factors are used to modify the attenuation to diode 5 to take into account the known non-linearities of the diodes 7 and 8.

In order to simplify the calibration of the diodes 7 and 8, they are preferably manufactured as two separate modules which do not interact, as this permits them to be calibrated separately, thus requiring the calibration equipment to cover only a 50 dB range. To avoid interaction the diodes may be as shown in FIG. 2 in which two groups 24 and 25 of diodes and 3 dB input and output couplers 26 and 27 of established design are used. Each group 24 or 25 corresponds respectively to a diode 7 or 8. In practice, the diodes are calibrated for the different attenuation steps at frequencies in excess of 100 MHz and the resulting correction factors are entered into the data store 17. When both diode modules have been installed into the attenuator circuit shown in FIG. 1 the attenuators are driven using the data held in data store 17 and the output level is checked over the range zero to 50 dB attenuation while the correction factors for one of the diode modules are adjusted to take into account the response of the R.F. line at high frequencies.

The individual attenuators may be calibrated using a standard attenuator and signal calibrator and by comparing the degree of attenuation provided with that theoretically predicted. Methods of calibrating attenuators are well known and so will not be described in detail, but one standard instrument which is suitable for the purpose is the Attenuator and Signal Calibrator model VM3 manufactured by Weinschel Engineering of the United States of America.

We claim:

1. A microwave attenuation circuit including at least two variable impedance diodes connected in a serial path, one end of which is arranged to receive an applied microwave signal and the other end of which provides an attenuated output signal, one diode forming part of a feedback loop in which a signal attenuated by it is combined with a variable reference signal representative of a particular degree of attenuation so as to control the attenuation of said one diode or diodes, the impedance of the further diode being variable in discrete steps by selection of particular values of a bias signal applied to it; and means for modifying the attenuation of said one diode in dependence on the value of the selected bias signal to compensate for non-linearities in said further diode or diodes.

2. A circuit as claimed in claim 1 and wherein said means includes a data store containing correction factors relating to each selectable value of bias signal.

3. A circuit as claimed in claim 2 and wherein the diodes are PIN diodes.

4. A circuit as claimed in claim 2 and wherein the correction factors held in said store also relate to the frequency of a signal applied to the microwave attenuation circuit.

5. A circuit as claimed in claim 2, and wherein at least two said further diodes are provided in said serial path and arranged so that the impedance of each can be varied independently in discrete steps.

6. A circuit as claimed in claim 5 and wherein each of said further diodes is provided with additional diodes associated with it to form a group of diodes which are ganged together.

7. A circuit as claimed in claim 6 and wherein two groups of such further diodes are provided in said serial path, each group being arranged so as not to interact with the other group.

* * * * *